(12) United States Patent
Dasgupta et al.

(10) Patent No.: US 10,979,012 B2
(45) Date of Patent: Apr. 13, 2021

(54) SINGLE-FLIPPED RESONATOR DEVICES WITH 2DEG BOTTOM ELECTRODE

(71) Applicant: INTEL CORPORATION, Santa Clara, CA (US)

(72) Inventors: Sansaptak Dasgupta, Hillsboro, OR (US); Marko Radosavljevic, Portland, OR (US); Han Wui Then, Portland, OR (US); Bruce A. Block, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 16/328,770

(22) PCT Filed: Sep. 30, 2016

(86) PCT No.: PCT/US2016/054686
§ 371 (c)(1),
(2) Date: Feb. 27, 2019

(87) PCT Pub. No.: WO2018/063291
PCT Pub. Date: Apr. 5, 2018

(65) Prior Publication Data
US 2019/0199312 A1   Jun. 27, 2019

(51) Int. Cl.
*H03H 3/02* (2006.01)
*H03H 9/02* (2006.01)
*H03H 9/58* (2006.01)

(52) U.S. Cl.
CPC .......... *H03H 3/02* (2013.01); *H03H 9/02015* (2013.01); *H03H 9/587* (2013.01);
(Continued)

(58) Field of Classification Search
CPC ...... H03H 3/02; H03H 9/02015; H03H 9/587; H03H 9/589
See application file for complete search history.

(56) References Cited

U.S. PATENT DOCUMENTS

2003/0025171 A1   2/2003   Geske et al.
2010/0123367 A1*  5/2010   Tai ..................... H03H 9/02574
                                                                310/313 B
(Continued)

FOREIGN PATENT DOCUMENTS

WO    2018063291 A1    4/2018

OTHER PUBLICATIONS

Niebelshuetz et al., Piezoelectric Actuated Epitaxially Grown AlGaN/GaN-resonators, 2 Jun. 2010, Physica Status Solidi C, 7 No. 7-8, 1829-1831 (Year: 2010).*

(Continued)

*Primary Examiner* — Samuel S Outten
(74) *Attorney, Agent, or Firm* — Schwabe, Williamson & Wyatt, P.C.

(57) ABSTRACT

Techniques are disclosed for forming integrated circuit single-flipped resonator devices that include an electrode formed of a two-dimensional electron gas (2DEG). The disclosed resonator devices may be implemented with various group III-nitride (III-N) materials, and in some cases, the 2DEG may be formed at a heterojunction of two epitaxial layers each formed of III-N materials, such as a gallium nitride (GaN) layer and an aluminum nitride (AlN) layer. The 2DEG electrode may be able to achieve similar or increased carrier transport as compared to a resonator device having an electrode formed of metal. Additionally, in some embodiments where AlN is used as the piezoelectric material for the resonator device, the AlN may be epitaxially grown which may provide increased performance as com- (Continued)

pared to piezoelectric material that is deposited by traditional sputtering techniques.

20 Claims, 9 Drawing Sheets

(52) U.S. Cl.
CPC ....... *H03H 9/589* (2013.01); *H03H 2003/021* (2013.01); *H03H 2003/025* (2013.01)

(56) References Cited

U.S. PATENT DOCUMENTS

| | | | |
|---|---|---|---|
| 2013/0277716 A1* | 10/2013 | Otsuji | H01L 31/02 257/252 |
| 2014/0070905 A1* | 3/2014 | Raieszadeh | C25D 1/003 333/174 |
| 2014/0159548 A1 | 6/2014 | Burak et al. | |
| 2015/0266725 A1 | 9/2015 | Baskaran | |
| 2016/0155673 A1 | 6/2016 | Kang | |
| 2017/0214381 A1* | 7/2017 | Bhattacharjee | H03H 9/0538 |
| 2017/0264256 A1* | 9/2017 | Gibb | H03H 3/02 |

OTHER PUBLICATIONS

International Search Report and Written Opinion received for PCT Application No. PCT/US2016/054686, dated May 24, 2017. 16 pages.

International Preliminary Report on Patentability received for PCT Application No. PCT/US2016/054686. dated Apr. 2, 2019. 12 pages.

Rats-Zadeh, et al., "Gallium Nitride as an Electromechanical Material," Journal of Microelectromechanical Systems, vol. 23, No. 6, Dec. 2014. pp. 1252-1271.

* cited by examiner

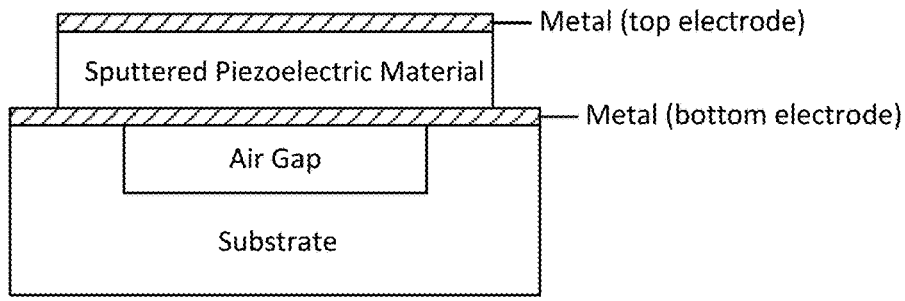

FIG. 1

Method 100

PROVIDE TRANSFER SUBSTRATE
102

[OPTIONAL] FORM BLOCKS OF SHALLOW TRENCH ISOLATION MATERIAL (STI)
104

[OPTIONAL] DEPOSIT NUCLEATION LATER
106

FORM III-N LAYER (e.g., GaN)
108

FORM POLARIZATION LAYER
110

FORM METAL CONTACTS FOR FBAR
112

[OPTIONAL] AT LEAST PARTIALLY REMOVE STI MATERIAL TO RELEASE FBAR
114

[OPTIONAL] DEPOSIT INTER LAYER DIELECTRIC (ILD) MATRIAL
116

ROTATE STACK AND BOND TO A PRE-PATTERNED HOST SUBSTRATE
118

REMOVE TRANSFER SUBSTRATE
120

FIG. 2

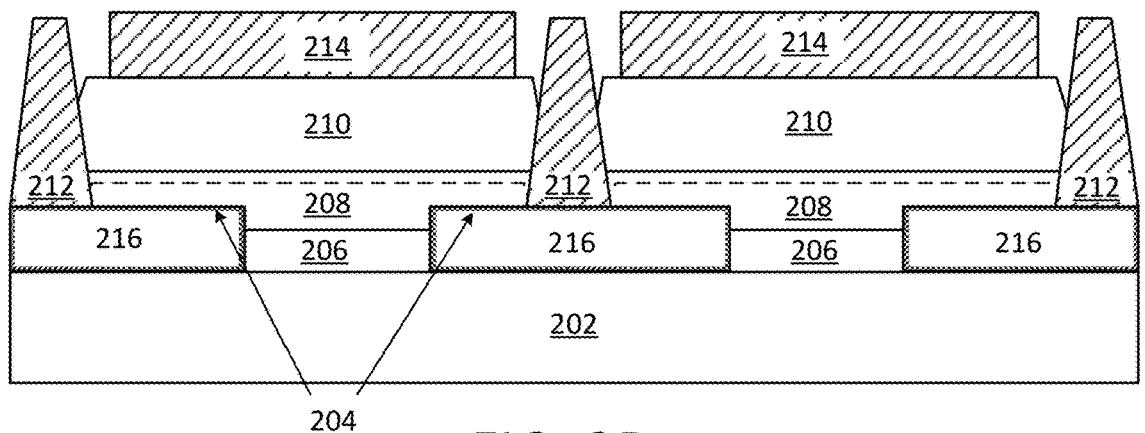
FIG. 3D
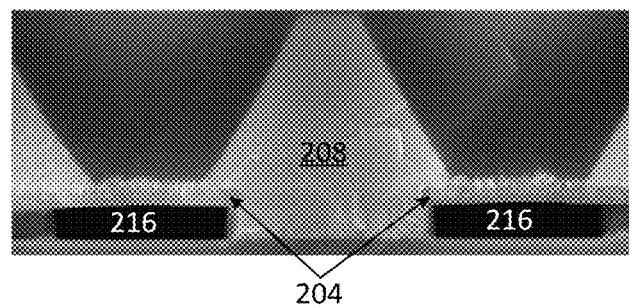
FIG. 3D'
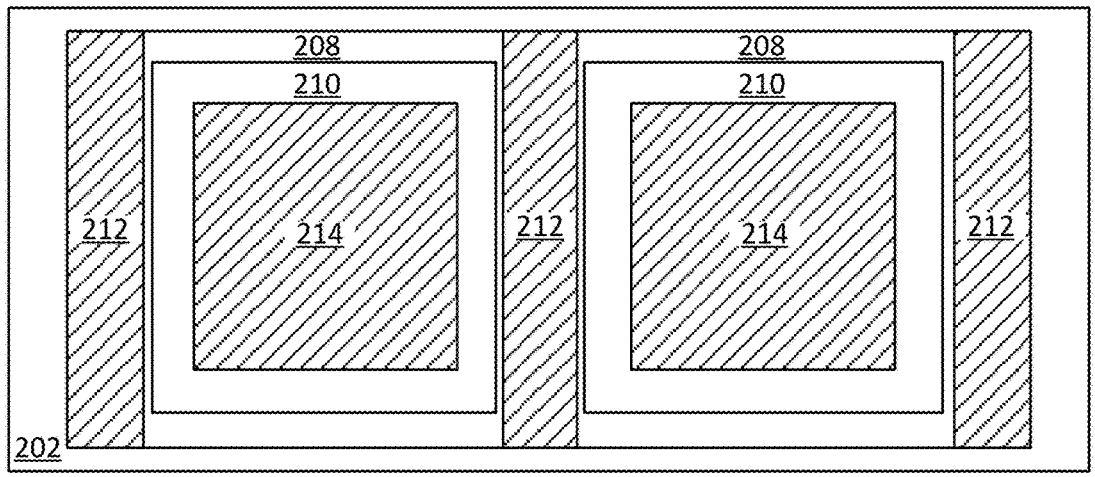
FIG. 3D"

SINGLE-FLIPPED RESONATOR DEVICES WITH 2DEG BOTTOM ELECTRODE

CROSS-REFERENCE TO RELATED APPLICATIONS

This patent application is a U.S. National Phase Application under 35 U.S.C. § 371 of International Application No. PCT/US2016/054686, filed on Sep. 30, 2016, the entire contents of which is hereby incorporated by reference herein.

BACKGROUND

Modern communication systems utilize radio frequency (RF) filters to convert electrical energy into mechanical energy and vice versa. Some RF filters employ film bulk acoustic resonators (FBARs), sometimes called thin-film bulk acoustic resonators (TFBARs). With the growing number of frequency bands and modes of communications, the quantity of RF filters in a typical mobile device has significantly increased.

BRIEF DESCRIPTION OF THE DRAWINGS

FIG. 1 illustrates a cross-section view of a film bulk acoustic resonator (FBAR) structure formed with a metal bottom electrode and a sputtered piezoelectric element.

FIG. 2 illustrates an example methodology for producing a single-flipped resonator device having a III-N 2DEG bottom electrode, in accordance with one or more embodiments of the present disclosure.

FIGS. 3A-3F illustrate example integrated circuit structures that may be formed when carrying out the method of FIG. 2, in accordance with various embodiments of the present disclosure.

Figure 3A:
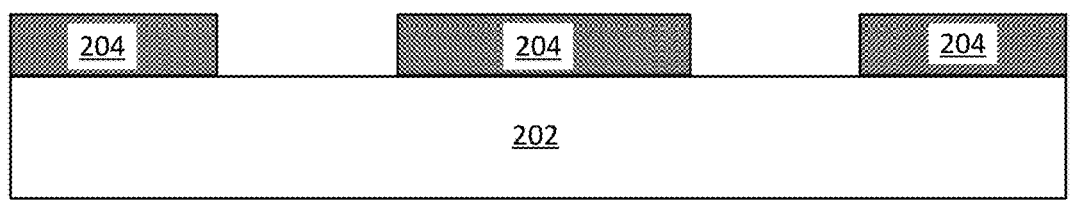
Figure 3A:
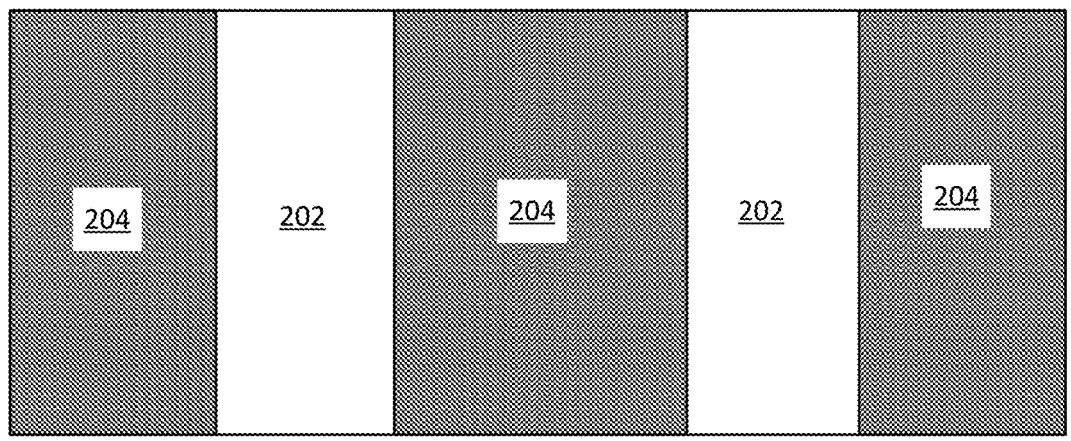

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming integrated circuit resonator devices having a bottom electrode formed of a two-dimensional electron gas (2DEG) layer. Example resonator devices include, for instance, film bulk acoustic resonators (FBARs) and solidly mounted resonators (SMRs). In some cases, the 2DEG is formed at a heterojunction of two epitaxial layers formed of group III-V materials, including group III material-nitride (III-N) compounds. In some such embodiments, a piezoelectric film may be used as a polarization layer and be positioned on a III-N layer that has a smaller band gap than the piezoelectric material. The polarization layer may, in some embodiments, include epitaxial III-N material(s). For example, in some particular embodiments, the 2DEG bottom electrode may be formed in a gallium nitride (GaN) III-N layer positioned under a polarization layer implemented with aluminum nitride (AlN).

The disclosed resonator devices may be formed on a substrate, referred to herein as a transfer wafer (or first substrate), and then may be inverted or single-flipped and bonded to a new support wafer, which is referred to herein as a host wafer (or second substrate). The backside of the transfer wafer can then be removed via some combination of grind, etch, and/or chemical mechanical polishing/planarization (CMP), with or without the use of an etch stop layer (e.g., a crystalline or amorphous insulator like silicon on insulator (SOI), for example). Such a substrate removal process is referred to as a backside reveal, as it reveals the backside or underside of the device layer, which may include one or more semiconductor devices (e.g., FBARs and/or SMRs), formed during front-end processing on the transfer wafer, thereby allowing subsequent processing to be performed from the backside of the device layer. As will be understood in light of the subject disclosure, for clarity and ease of description, the components of the structures described herein may be referenced by their positioning or orientation during formation on the transfer wafer as opposed to their positioning or orientation after being single-flipped and bonded to the host wafer. For example, the top electrode of the disclosed resonator devices may be positioned above the bottom electrode when formed on the transfer wafer, but after being single-flipped and bonded to the host wafer, the top electrode may be positioned underneath the bottom electrode.

The disclosed single-flipped resonator devices may provide numerous benefits as compared to resonator devices that include metal electrodes and/or sputtered piezoelectric material. For example, an FBAR or SMR device that includes a 2DEG bottom electrode may be able to achieve similar or increased carrier transport as compared to an FBAR or SMR device having a bottom electrode formed of metal. Additionally, FBAR or SMR devices that include epitaxial piezoelectric films as disclosed herein may have increased performance as compared to FBAR or SMR devices having piezoelectric materials deposited by sputtering, which limits the quality of the material. Specifically, the structure of a film formed by sputtering is not monocrystalline, and is instead amorphous or polycrystalline. The disclosed epitaxial piezoelectric films, in contrast, may have a structure that is at least partially monocrystalline (sometimes referred to as single crystal), as a result of epitaxy. To this end, use of "epitaxial" herein as an adjective (e.g., epitaxial layer) is intended to refer to the single crystal structure of at least part of the layer being described. In some embodiments, the piezoelectric material of the disclosed resonator devices may have a relatively small X-ray rocking curve FWHM value, indicating a higher crystallographic quality and thus a higher piezoelectric coupling coefficient, which leads to RF filters including such FBAR and SMR devices having higher Q-factors. Therefore, the techniques variously described herein can be used to form higher quality FBAR and SMR structures and thus higher quality RF filters, even when the RF filters are used to filter high frequencies (e.g., 3 GHz or greater). Moreover, the disclosed techniques of forming single-flipped resonator devices may, in some cases, allow FBAR and SMR devices having epitaxial piezoelectric material and 2DEG bottom electrodes to be used in connection with various underlying host wafers, thereby providing increased versatility for implementation. Numerous other configurations and variations will be apparent in light of this disclosure.

General Overview

Radio Frequency (RF) interference can inhibit communication and RF filters or resonators can be incorporated into communication devices to filter RF interference. Bulk acoustic wave (BAW) filters are a type of RF filter that function by resonating vertically. A film bulk acoustic resonator (FBAR) is a type of BAW filter that includes an air cavity formed under a suspended film of piezoelectric material, allowing the piezoelectric film to resonate. The FBAR device also includes a bottom electrode and a top electrode. A solidly mounted resonator (SMR) is a type of BAW filter that includes a piezoelectric material positioned between a top electrode and a bottom electrode that is attached to a distributed Bragg reflector (DBR) on a substrate. In FBAR and SMR devices, the resonance frequency is determined by the thickness of a piezoelectric layer as well as the thickness of the resonator electrodes and additional layers in which mechanical energy may be stored. In such piezoelectric resonators, an acoustic standing wave is generated within the piezoelectric layer. In this way, such filters can selectively pass RF data of interest when a signal is applied to the filter that triggers the resonant response. FIG. 1 illustrates the structure of an example FBAR device that employs metal electrodes and sputtered piezoelectric material.

In contrast, and in accordance with embodiments of the present disclosure, a resonator device (e.g., FBAR or SMR device) is configured with a bottom electrode formed of a two-dimensional electron gas (2DEG) layer. In accordance with these and other embodiments of the subject disclosure, the piezoelectric material of the resonator device may be formed, at least partially, using lateral epitaxial overgrowth or so-called LEO techniques to produce an epitaxial film. The disclosed resonator devices having 2DEG bottom electrodes can provide comparable or improved carrier transport, relative to resonator devices with metal bottom electrodes. Additionally, as will be further appreciated in light of this disclosure, the disclosed resonator devices may include epitaxial piezoelectric materials that have increased purity and monocrystalline structure relative to piezoelectric materials deposited by sputtering, thereby preserving performance of the resonator device.

In accordance with some example embodiments, the piezoelectric material of the disclosed resonator devices may be implemented with various group III-V materials, including group III-nitride (III-N) compounds, including aluminum nitride (AlN) and/or gallium nitride (GaN). Due to its piezoelectricity, AlN may be particularly useful for implementing high performance RF filters, such as FBAR and SMR devices.

From a structural viewpoint, the disclosed single-flipped resonator devices as provided herein may include various cross-section profiles. For example, in some embodiments, the single-flipped resonator device may be a single-flipped FBAR that includes a III-N layer, a polarization layer formed on the III-N layer, an air cavity formed underneath the III-N layer, a top electrode formed on the polarization layer, and a bottom electrode comprising a 2DEG region formed in the III-N layer, wherein the top electrode is bonded (either directly or indirectly) to a substrate that may, in some embodiments, include a DBR and/or underlying circuitry on a host substrate. In other embodiments, the disclosed single-flipped resonator device may be an FBAR device that includes a nucleation layer, a buffer layer formed on the nucleation layer, a III-N layer formed on the buffer layer, a polarization layer formed on a III-N layer, a bottom electrode comprising a 2DEG region formed in the III-N layer, a top electrode formed on the polarization layer, wherein the top electrode is bonded (either directly or indirectly) to a substrate that may, in some embodiments, include a pre-formed air cavity and/or underlying circuitry on a host substrate. In other embodiments, the disclosed resonator device may be a single-flipped SMR that includes a III-N layer, a polarization layer formed on the III-N layer, a top electrode formed on the polarization layer, and a bottom electrode comprising a 2DEG region formed in the III-N layer, wherein the top electrode is bonded (either directly or indirectly) to a substrate that may, in some embodiments, include a DBR and/or underlying circuitry on a host substrate. As will be apparent, the disclosed techniques may, in some embodiments, provide increased integration of various RF frontend components.

In some embodiments, the polarization layer may be implemented with aluminum nitride, and in some example structures the aluminum nitride may be at least partially formed by lateral epitaxial overgrowth techniques to form an epitaxial film. In some particular embodiments, the disclosed single-flipped resonator devices may also include an epitaxial nucleation layer comprising III-N material positioned under the III-N layer, which may allow the III-N layer and the polarization layer to be epitaxially formed on a silicon transfer substrate. Depending on method of formation, some example single-flipped resonator devices as presently disclosed may include shallow trench isolation (STI) material lining the air cavity, which may, in some circumstances, provide structural support for the components of the resonator device.

While some of the example single-flipped resonator device discussed in detail include a III-N layer implemented with GaN and a polarization layer implemented with AlN, it is important to note that any other suitable III-N materials may be used in alternative embodiments, as will be appreciated. Additionally, although FBAR and SMR devices are discussed in detail throughout the subject disclosure, note, however, that the subject disclosure is not intended to be limited to FBARs and SMRs and the disclosed techniques may be used to form other types of RF filter structures instead of or in addition to FBARs and/or SMRs. Numerous configurations and variations will be apparent in light of the subject disclosure.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, or high resolution physical or chemical analysis, to name some suitable example analytical tools may also be used to detect the techniques and structures provided herein. In some embodiments, for instance, a SEM may indicate a single-flipped resonator device having a III-N 2DEG bottom electrode and an epitaxial III-N material stack. Numerous configurations and variations will be apparent in light of this disclosure.

The semiconductor structures variously described herein may be suitable for numerous applications, such as the personal computers (PC), tablet computers, smartphones, test equipment, power management and communication applications, as well as power conversion and automotive applications, to name a few examples. The structure may be included in an integrated circuit chip or chip set, such as a system-on-chip (SOC). Numerous configurations and variations will be apparent in light of this disclosure.

Architecture and Methodology

FIG. 2 illustrates a method 100 of forming a single-flipped RF filter having a 2DEG bottom electrode in accordance with one or more embodiments of the present disclosure. FIGS. 3A-3F illustrate example structures that may be formed when carrying out method 100 of FIG. 2, in accordance with some embodiments. As will be appreciated in light of this disclosure, the disclosed techniques may be used to form various types of RF Filters, such as, for example, bulk acoustic wave (BAW) filters, including solidly mounted resonators (SMRs), film bulk acoustic resonators (FBARs) and thin-film bulk acoustic resonators (TFBARs).

As shown in FIG. 2, method 100 includes providing 102 a transfer substrate and optionally forming 104 blocks of shallow trench isolation material (STI) on the transfer substrate to produce a structure as shown in FIG. 3A (side view) and FIG. 3A' (top view), in accordance with an example embodiment. Transfer substrate 202 may be formed of any suitable semiconductor material, including group IV semiconductor materials such as silicon (Si), silicon carbide (SiC), sapphire, germanium (Ge), or silicon germanium (SiGe). In some embodiments, transfer substrate 202 may be an X on insulator (XOI) structure where X comprises Si, Ge, SiC, SiGe, or sapphire, and the insulator material may be an oxide material, a dielectric material, some other electrically insulating material, or a multilayer structure where the top layer comprises Si, Ge, SiC, SiGe, or sapphire. In some embodiments where transfer substrate 202 is implemented with silicon, the silicon may be prepared to expose a particular plane of its crystal structure as defined by a Miller index number. For example, in some embodiments, transfer substrate 202 may include Si 111, Si 110, Si 100 with an offcut of between 2 to 8 degrees toward 110, or equivalents thereof. Transfer substrate 202 may have any suitable thickness, such as a thickness in the range of 100 to 950 microns, in the case of a bulk substrate. STI material 204 may comprise any suitable insulating material, such as one or more oxides (e.g., silicon dioxide) and/or nitrides (e.g., silicon nitride). In some embodiments, the STI material 204 may be selected based on the transfer substrate material. For example, in the case of a silicon transfer substrate 202, STI material 204 may be silicon dioxide or silicon nitride. As shown in FIGS. 3A (side view) and 3A' (top view), blocks of STI material 204 may be deposited on transfer substrate 202. Blocks of STI material 204 may have any suitable dimensions, including a width between 50 and 100 μm and a height between 100 and 500 nm. Blocks of STI material 204 may be spaced apart from one another on transfer substrate 202 and in some embodiments there may be between 50 and 100 μm between blocks of STI material 204. Blocks of STI material 204 may be formed on transfer substrate 202 by any suitable technique, including by chemical vapor deposition (CVD), atomic layer deposition (ALD), physical vapor deposition (PVD), or any other appropriate process. Various lithography techniques may be used to form blocks of STI material 204, for example a layer of STI material may be deposited on transfer substrate 202 and then be selectively etched to form blocks of STI material 204. Numerous configurations will be apparent in light of the present disclosure.

Figure 3B:
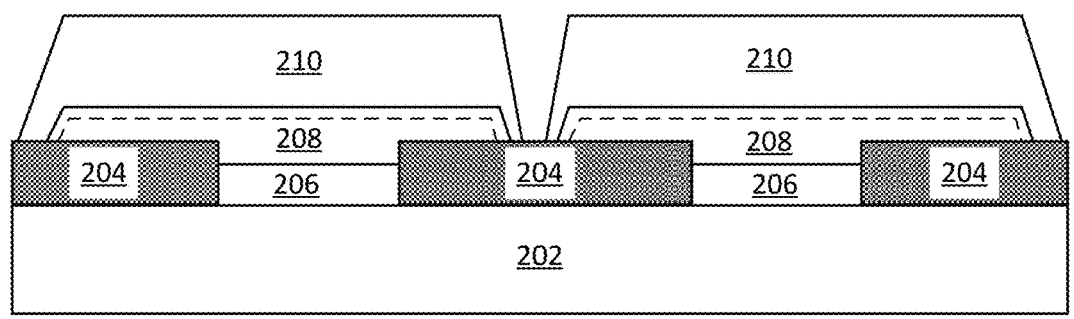

Method 100 of FIG. 2 continues with optionally depositing a nucleation layer on the transfer substrate to form a structure as shown in FIG. 3B, in accordance with an example embodiment. Nucleation layer 206, if present, may be positioned between the blocks of STI material 204 and in some embodiments may have a thickness that is less than the thickness of adjacent blocks of STI material 204, as shown in FIG. 3B. Nucleation layer 206 may be formed to prevent subsequent layers (e.g., layer 208) from reacting with the transfer substrate material. However, in some embodiments, nucleation layer 206 may not be needed, for example, where layer 208 is compatible with transfer substrate 202.

Accordingly, in some embodiments, nucleation layer 206 may be optional. If present, nucleation layer 206 may be implemented with a III-V material, such as AlN, AlGaN, or a low temperature GaN (e.g., epitaxially grown at a temperature in the range of 700 to 900° C., or any other appropriate material. In some particular embodiments, nucleation layer 206 may have a thickness between 0.05 to 1 micron (e.g., 50 to 200 nm), less than 200 nm, less than 150 nm, less than 100 nm, or less than 50 nm, depending on end use or target application. Nucleation layer 206 may be formed by any suitable process, such as by metal-organic chemical vapor deposition (MOCVD), molecular beam epitaxy (MBE), hydride vapor phase epitaxy (HVPE), in some embodiments.

Method 100 of FIG. 2 continues with forming 106 a III-N layer on nucleation layer 206 (if present) and STI material 204 to produce a structure as shown in FIG. 3B, in accordance with an example embodiment. III-N layer 208 may be implemented with gallium nitride (GaN), or another III-N material, such as aluminum nitride (AlN) or indium nitride (InN). As used herein, group III-N semiconductor material (or III-N material or simply III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN), to name a few examples of III-N materials. In a more inclusive manner, note that a group III-V material, as used herein, includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Numerous group III-V material systems can be used to implement single-flipped FBAR devices as provided here in various embodiments of the present disclosure. In some embodiments, III-N layer 208 comprises at least 50%, at least 60%, at least 70%, at least 80%, at least 90%, at least 95%, or 100% GaN. In some embodiments, III-N layer 208 may have a thickness of less than, more than, or approximately 100 nm on the STI material 204. In some embodiments where III-N layer 208 is implemented with GaN, the GaN may be epitaxially grown, such as by liquid phase epitaxy (LPE), MOCVD, HVPE, MBE, or any other suitable deposition process. In some embodiments, growth conditions may be adjusted based on the desired resulting characteristics of the III-N layer.

Method 100 of FIG. 2 continues with forming 110 a polarization layer 210 on III-N layer 208 to produce a structure as shown in FIG. 3B, in accordance with an example embodiment. Polarization layer 210 may include any type of III-V compounds, such as AlN, GaN, InN, or other III-N materials. The thickness of polarization layer 210 may vary based on the end use or desired application. For example, in some embodiments, polarization layer 210 may have a thickness between 1 and 2 microns. In embodiments where the resonator structure is to be used in an RF filter, the thickness of polarization layer 210 may be selected based on the desired frequency to be filtered by the RF filter device. For example, a thinner polarization layer 210 may be used to filter higher frequencies (e.g., frequencies greater than 1, 2, 3, 4, or 5 GHz) whereas a thicker polarization layer may be used to filter lower frequencies (e.g., frequencies less than 1 GHz). Polarization layer 210 may be formed by any suitable process, and in some embodiments polarization layer 210 may be epitaxially grown on III-N layer 208, such as by MOCVD, HVPE, or MBE. In embodiments where polarization layer 210 includes an epitaxial III-N material (e.g., AlN), the III-N material may have a crystallinity characterized by an X-ray rocking curve FWHM of less than 2 degrees, 1.5 degrees, 1 degree, 0.5 degrees, or some other suitable maximum as will be apparent in light of the present disclosure. In some embodiments, the entire thickness of polarization layer 210 may be formed of epitaxial material, whereas in other embodiments, only a portion of polarization layer 210 may be formed of epitaxial material. For example, a portion of polarization layer 210 may be epitaxially grown on III-N layer 208 and additional material may then be sputtered or otherwise deposited on the epitaxial material of the polarization layer to complete formation of polarization layer 210, in some embodiments. In some such embodiments, at least 5%, at least 10%, at least 20%, or at least 25% of polarization layer 210 may include epitaxial material.

In some example embodiments, a two-dimensional electron gas (2DEG) region may be induced or otherwise formed in the III-N layer 208 due to the built-in electric field caused at the heterojunction of III-N layer 208 and polarization layer 210 that can provide increased carrier mobility. Example 2DEG regions in III-N layer 208 are illustrated in FIG. 3B. In some embodiments, polarization layer 210 may be implemented with a material having a larger bandgap than the material of III-N layer 208. For example, in some particular embodiments, polarization layer may be formed of AlN and III-N layer 208 may be formed of GaN.

Figure 3C:
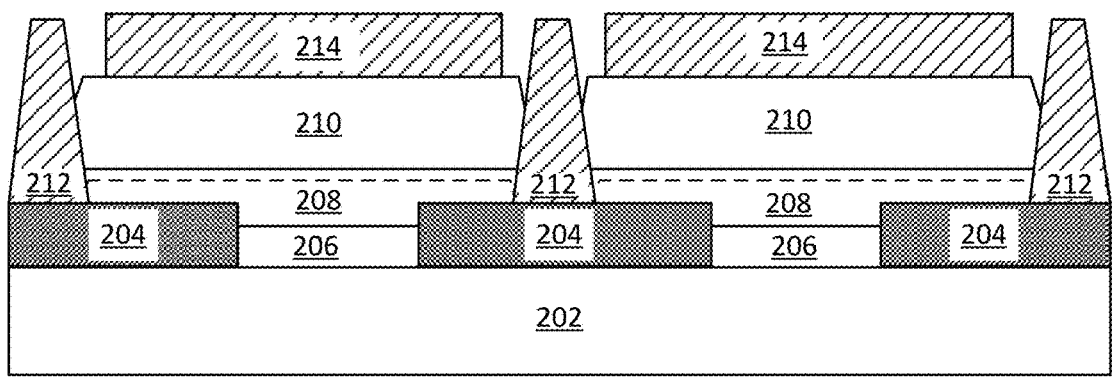

Method 100 of FIG. 2 continues with forming 112 metal contacts for resonator device to produce a structure as shown in FIG. 3C. As shown in FIG. 3C, bottom electrode contact 212 may be formed on STI material 204 and may contact the sidewall of the 2DEG region formed at the interface of III-N layer 208 and polarization layer 210. The bottom electrode contact 212 may thus allow the 2DEG layer (generally, the III-N layer 208) to s the bottom electrode of the resonator device. Top electrode 214 may be formed on polarization layer 210 serve as, as shown in FIG. 3C, in accordance with some example embodiments. Bottom electrode contact 212 and top electrode 214 may be implemented with any suitable materials, including hard metals, such as tungsten (W) and/or molybdenum (Mo). In some embodiments, bottom electrode contact 212 may be formed of the same material(s) as top electrode 214 while in other embodiments bottom electrode contact 212 and top electrode 214 may be formed of different material(s). In some embodiments, top electrode 214 may have a thickness of between 100 and 300 nm. Bottom electrode contact 212 may be formed to have any desired thickness. For example, in some embodiments, bottom electrode contact 212 may be formed to have a top surface at approximately the same height as the top electrode or, in other embodiments, may be formed to have a top surface below the height of the top electrode. In some particular embodiments, bottom electrode contact 212 may have a thickness of between 1 micron and 3 microns, such as between 1.2 microns and 2.4 microns. Formation of top electrode 214 and bottom electrode contact 212 may include any suitable deposition and/or patterning processes, such as an atomic layer deposition (ALD) process, for example. In some embodiments, various layers, including III-N layer 208 and/or polarization layer 210 may be formed with one or more sloped edges to provide access for bottom electrode contact 212, as shown in FIG. 3B. However, in accordance with some other embodiments, III-N layer 208 and polarization layer each may be substantially planar. In various embodiments, III-N layer 208 and/or polarization layer 110 may be partially etched to form a trench in which bottom electrode contact 212 may be formed. Numerous configurations and variations will be apparent in light of the subject disclosure.

Method 100 of FIG. 2 continues with optionally at least partially removing 114 STI material 204 to release the FBAR structure and form air cavity to provide a structure as shown in FIG. 3D, in accordance with some example embodiments. STI material 204 may be removed by any appropriate technique, including by one or more etching processes, and in some embodiments may include the use of buffered or unbuffered hydrofluoric acid (HF) and/or TriMix etchant. In some embodiments, the etch chemistry used to remove STI material 204 is selective to the STI material 204 (i.e., it only removes the STI material 204 and doesn't remove (or otherwise only minimally removes) the other exposed materials. Note that air cavity 215 may be formed to have any desired width, depending on end use or target application. In some particular example embodiments, STI material 204 may be laterally etched. For example, as opposed to methods that remove material in a downward direction, in a lateral etching method an etchant may remove STI material 204 laterally (e.g., from the sides), in some examples. Upon formation of air cavity 216 by removal of STI material 204, the FBAR structure is released, allowing the piezoelectric material to resonate. As will be understood in light of the subject disclosure, in embodiments where an SMR is formed, STI material 204 need not be removed, in some embodiments, to release an FBAR structure.

As shown in FIG. 3D, some STI material 204 may remain after etching or other STI removal processes. FIG. 3D' is an electron microscope image of residual STI material 204 present after etching an example structure containing STI material 204 and a III-N layer 208 to form air cavity 216. In particular, FIG. 3D' shows possible real-world structural features that may be present in an FBAR device formed by the disclosed methods. Specifically, FIG. 3D' shows that residual STI material may be present between the top of an air cavity, contacting III-N layer 208. Residual STI material 204 may also be present on vertical sidewalls of the air cavity as well as on the bottom surface of the air cavity. In some embodiments, high temperatures used for epitaxial growth allow residual STI material 204 to remain adhered to III-N layer 208 and/or other regions adjacent to air cavity 216 (e.g., transfer substrate 202 and nucleation layer 206) even after etching. In addition to other possible benefits, residual STI material 204 may provide support for the FBAR structure.

FIG. 3D" is a top view of the structure shown in FIG. 3D, in accordance with some example embodiments. As shown in FIG. 3D", top electrode 214 and bottom electrode contact 212 may be available for contact from above. It will be understood that although depicted linearly in FIG. 3D", the components of the disclosed FBAR devices (e.g., transfer substrate 202, III-N layer 208, polarization layer 210, bottom electrode contact 212 and/or top electrode 214) may be non-linear, in some embodiments.

Figure 3E:
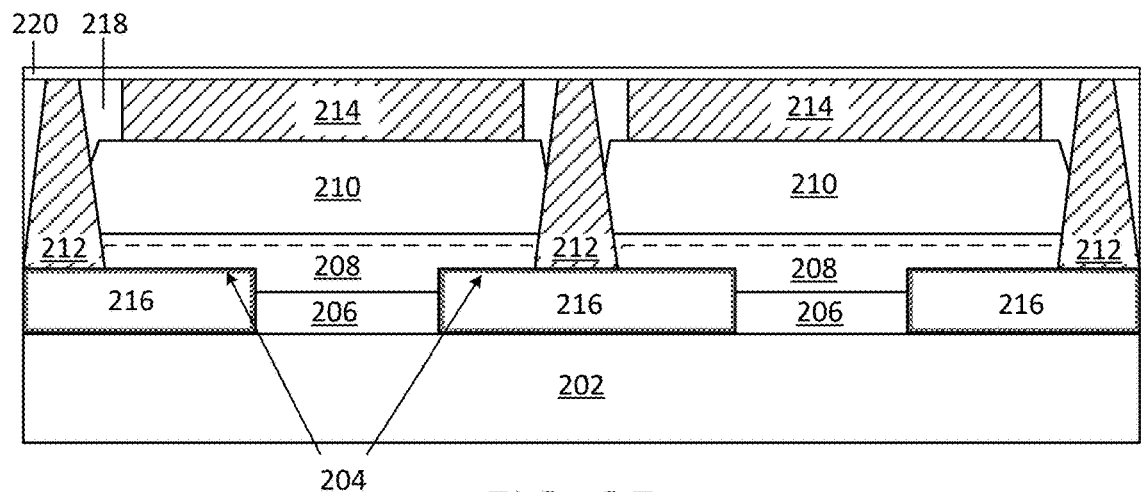

Method 100 continues with optionally depositing 116 inter layer dielectric (ILD) material to form a structure as shown in FIG. 3E, in accordance with some example embodiments. Prior to depositing ILD material, the FBAR structure may optionally be planarized, if desired, using any appropriate planarization technique. If present, ILD material 218 may be implemented with any dielectric material, including various oxides, such as silicon dioxide, silicon nitride, or other spin-on dielectrics. After deposition of ILD material 218, a thin layer of ILD material 220 may then be deposited, as shown in FIG. 3E. In some specific example embodiments, ILD material 220 may be implemented with silicon dioxide. ILD material 220 may have any desired thickness, such as less than 300 nm, less than 200 nm, less than 150 nm, or less than 100 nm, in accordance with some example embodiments. Any suitable deposition technique may be used to deposit ILD materials 218 and 220, including chemical vapor deposition (CVD), atomic layer deposition (ALD), physical vapor deposition (PVD), or any other appropriate process.

Figure 3F:
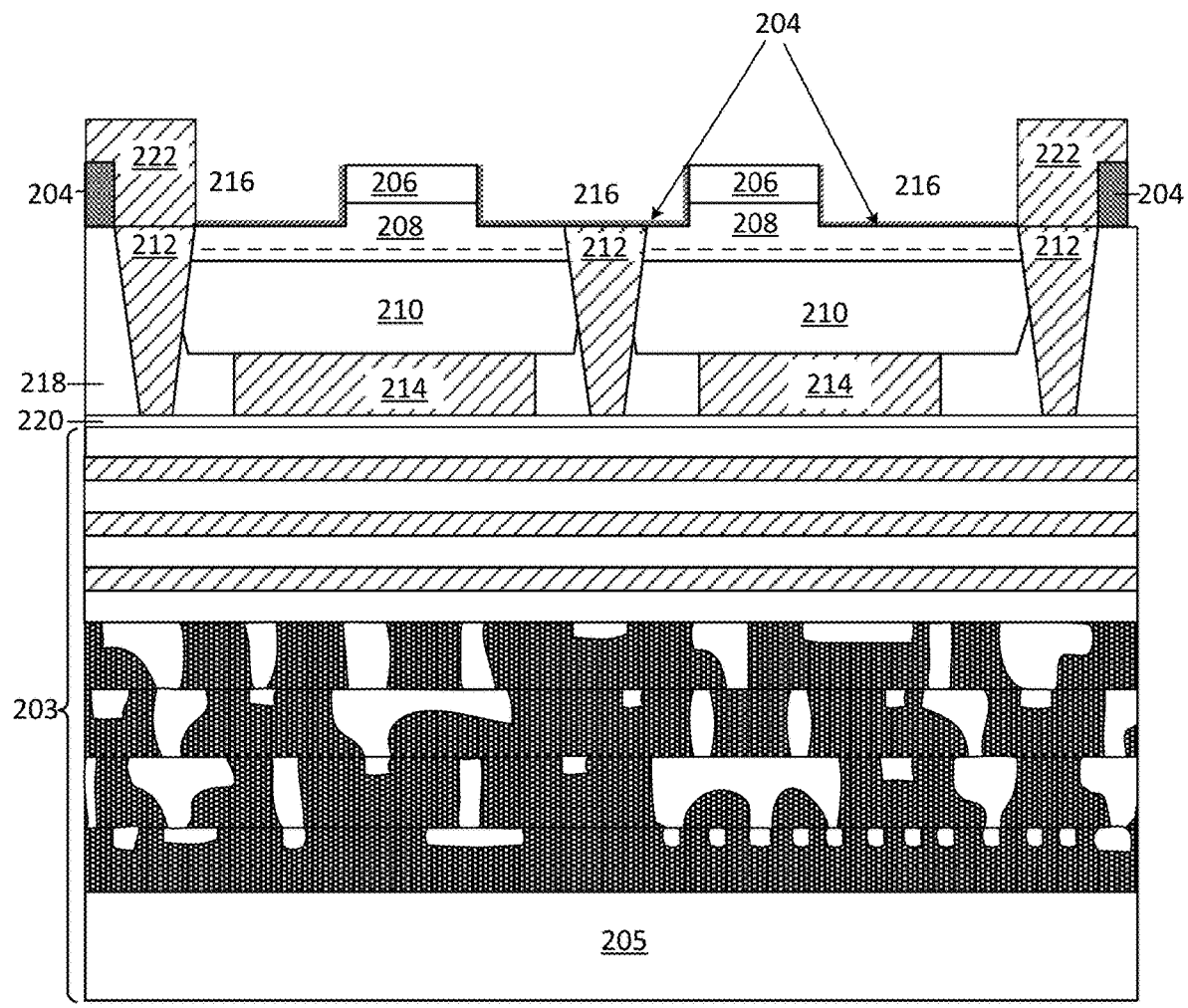

Method 100 continues with rotating, or flipping the structure formed on transfer wafer 202 and bonding 118 to a pre-patterned host substrate 203 to form a structure as shown in FIG. 3F, in accordance with some example embodiments. Pre-patterned host substrate 203 may be any type of substrate and, in some embodiments, may include underlying circuitry, a pre-formed air cavity, a distributed Bragg reflector (DBR), and/or interconnect features. For example, the host wafer 203 shown in FIG. 3F includes a DBR with underlying interconnect features on a host substrate 205. Host substrate 205 may be implemented with any material, as desired and in some embodiments, host substrate 205 may be any material described with respect to transfer substrate 202. The bonding process may be performed using any suitable techniques, such as using any combination of heat, pressure, and/or force to physically connect the structure on transfer substrate 202 to the structure of host wafer 203. In some cases, ILD material 220 may be bonded to an exposed material of host wafer 203. In some particular embodiments, ILD material 220 may be bonded to an ILD material of host wafer 203, as is shown in FIG. 3F, although in other embodiments, other materials may be bonded to transfer the structure on transfer substrate 202 to host substrate 205, as explained herein.

Method 100 continues with removing 120 transfer substrate 202, to form a structure as shown in FIG. 3F, in accordance with some example embodiments. Transfer substrate 202 may be removed by any suitable technique, including via mechanical processes, such as grinding. In accordance with some example embodiments, electrically conductive material 222 may be deposited on bottom electrode contact 212 to provide a desired height and position for components to contact the 2DEG bottom electrode. FIG. 3F shows an example structure that includes electrically conductive material 222 positioned on bottom electrode contact 212. Electrically conductive material 222 may include any suitable conductive material, including any material described with respect to bottom electrode contact 212, such as tungsten (W) and/or molybdenum (Mo). Numerous configurations and variations will be apparent in light of the subject disclosure.

Alternate Architectures and Methodologies

Figure 4A:
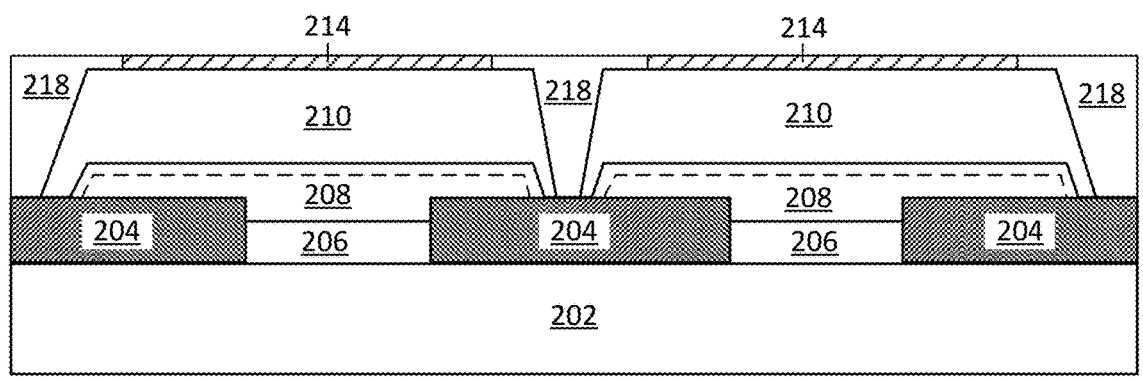
FIGS. 4A-4D illustrate example integrated circuit structures that may be formed when carrying out alternative methods of forming single-flipped resonator device having a III-N 2DEG bottom electrode, in accordance with one or more embodiments of the present disclosure.

In addition to method 100, single-flipped resonator devices may be produced using numerous alternative methods, some of which are described in detail herein. For example, FIGS. 4A-4D show example structures that may be formed during production of single-flipped resonator devices, in accordance with some example embodiments. Specifically, after forming 110 polarization layer 210 to produce the example structure shown in FIG. 3B, top metal electrode 214 may be deposited to form the example structure as shown in FIG. 4A, in accordance with some example embodiments. Top electrode 214 may be formed directly on polarization layer 210, as shown in FIG. 4A, in accordance with some example embodiments. Top electrode 214 may be implemented with any suitable material, including but not limited to tungsten (W) and/or molybdenum (Mo). Top electrode 214 may be formed by any technique, including by CVD. In accordance with some example embodiments, ILD material 218 may be deposited on the example structure, as shown in FIG. 4A.

Figure 4B:
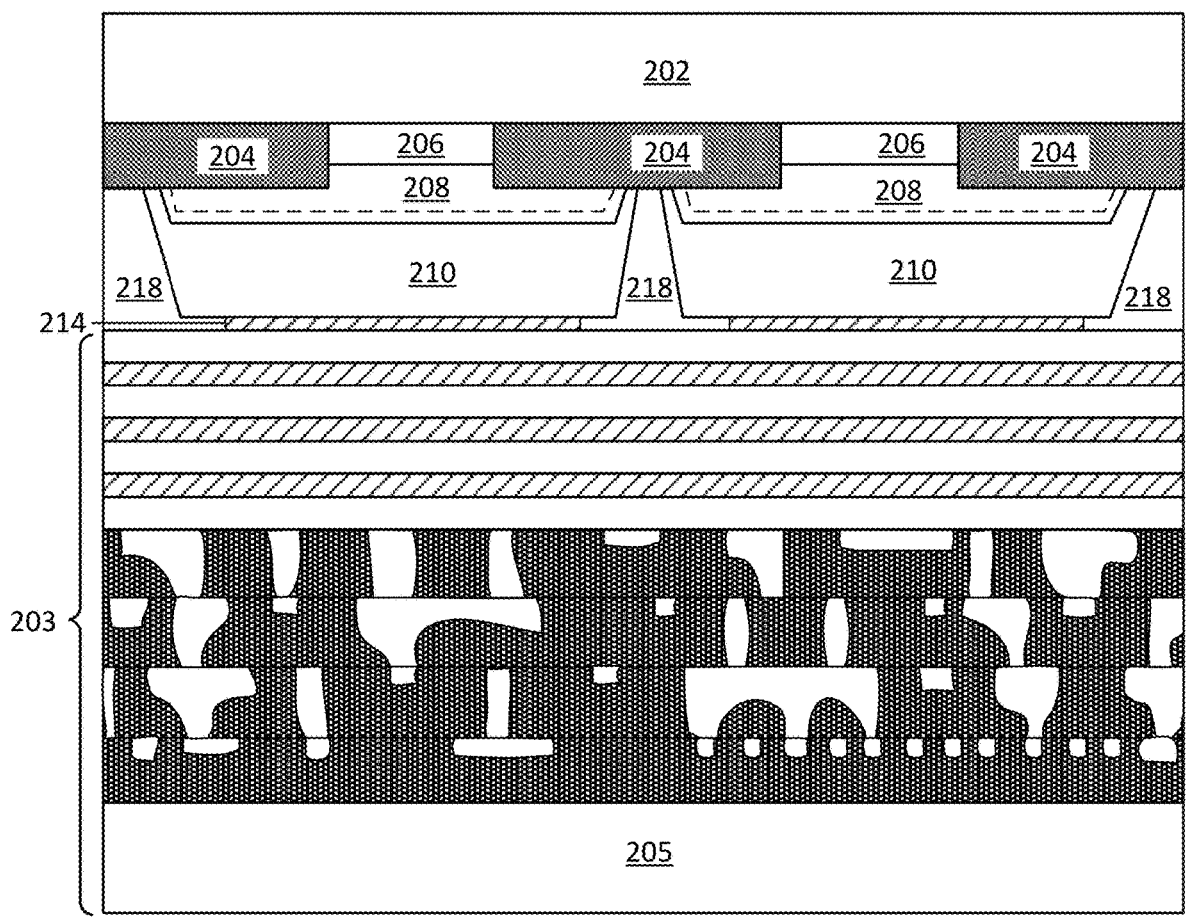

After depositing top metal electrode 214, the structure on transfer substrate 202 may then be inverted or single-flipped and bonded to a host wafer 203. Transfer substrate 202 may then be removed (e.g., by grinding) to produce a structure as shown in FIG. 4B, in accordance with some example embodiments. Host wafer 203 may include any desired structures, including but not limited to a pre-formed air cavity, a distributed Bragg reflector (DBR), and/or interconnect features. In accordance with some example embodiments, the example structure shown in FIG. 4B may include a DBR and underlying circuitry on host substrate 205. Top electrode 214 may be bonded to any desired underlying layer, including to a layer of dielectric material (e.g., silicon dioxide), as shown in the example structure shown in FIG. 4B, in accordance with some example embodiments.

Figure 4C:
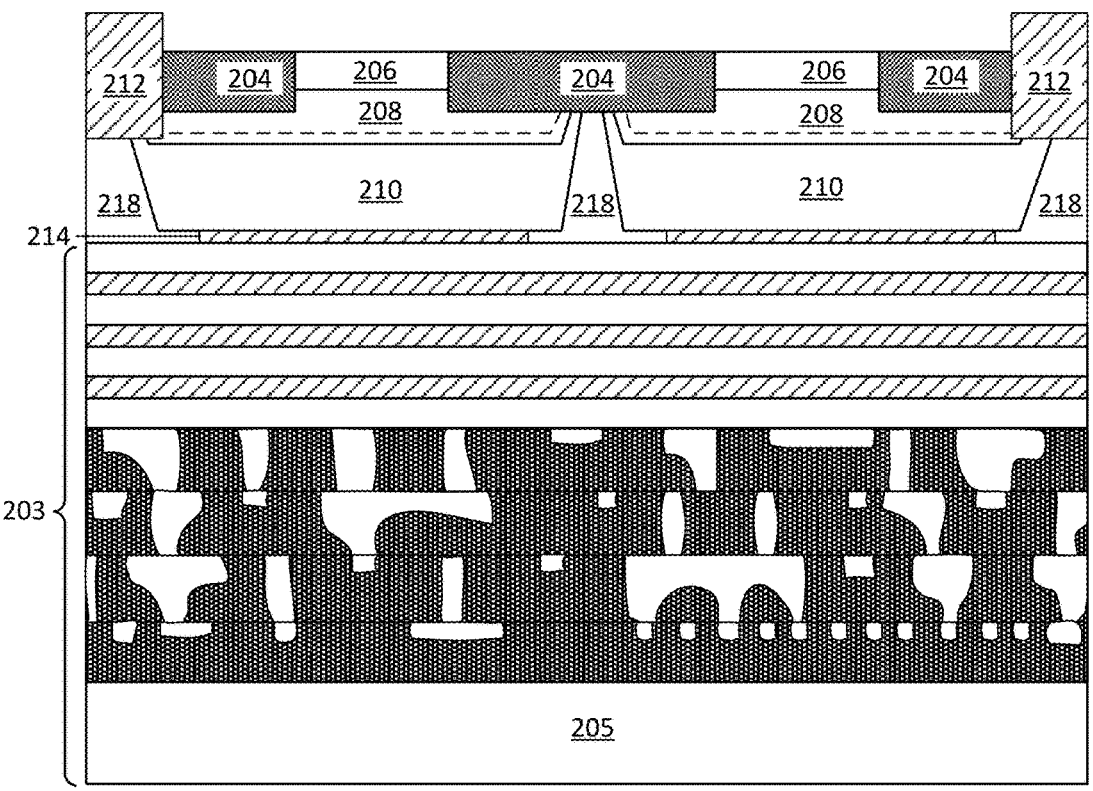

After removal of substrate 202, bottom electrode contact 212 may then be formed to contact the 2DEG region formed in III-N layer 208, to produce a structure as shown in FIG. 4C, in accordance with some example embodiments. Prior to formation of bottom electrode contact 212, underlying STI material 204, polarization layer 210 and/or III-N layer 208 may first be etched or otherwise patterned to provide a location for bottom electrode contact 212 to be formed. Bottom electrode contact 212 may be formed by any appropriate process, including by ALD, and may be implemented with any suitable materials, including hard metals, such as tungsten (W) and/or molybdenum (Mo).

Figure 4D:
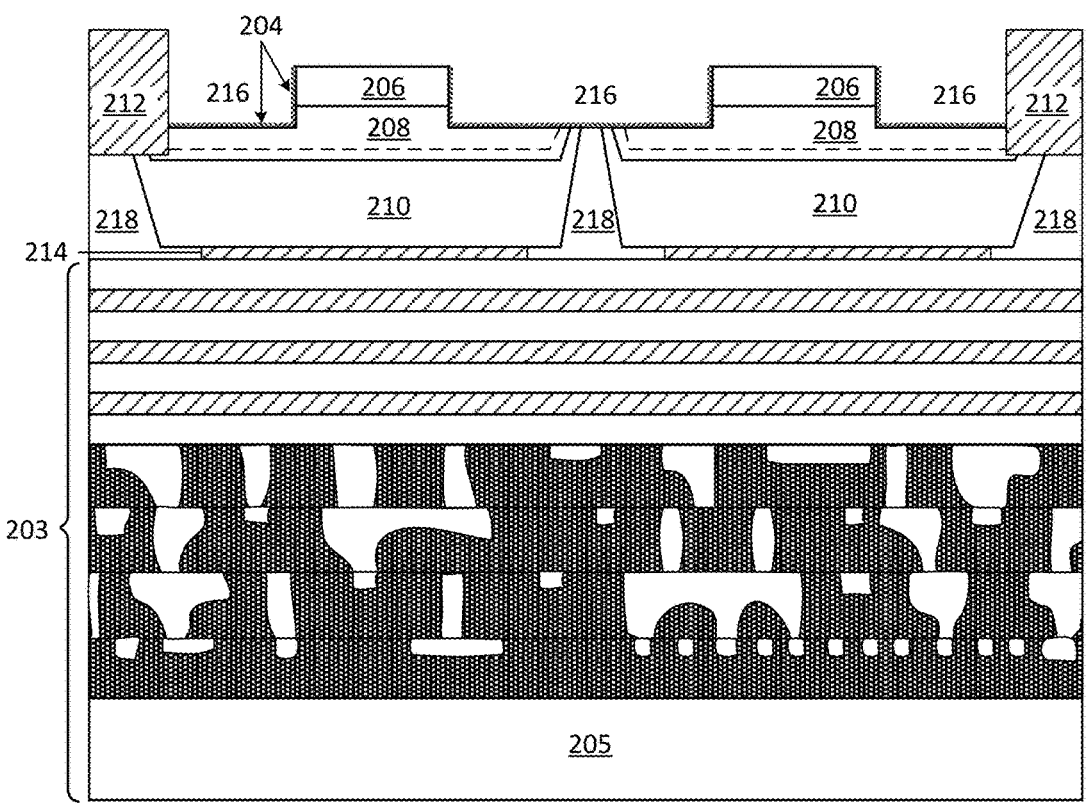

After formation of bottom electrode contact 212, at least a portion of the STI material 204 may then be removed to produce a structure as shown in FIG. 4D, in accordance with some example embodiments. STI material 204 may be removed by any appropriate technique, including by one or more etching processes, and in some embodiments, buffered or unbuffered hydrofluoric acid (HF) and/or TriMix etchant may be used. In some embodiments, the etch chemistry used to remove STI material 204 is selective to the STI material 204 (i.e., it only removes the STI material 204 and doesn't remove (or otherwise only minimally removes) the other exposed materials. As shown in FIG. 4D, some STI material 204 may remain after etching or other STI removal processes.

Figure 5A:
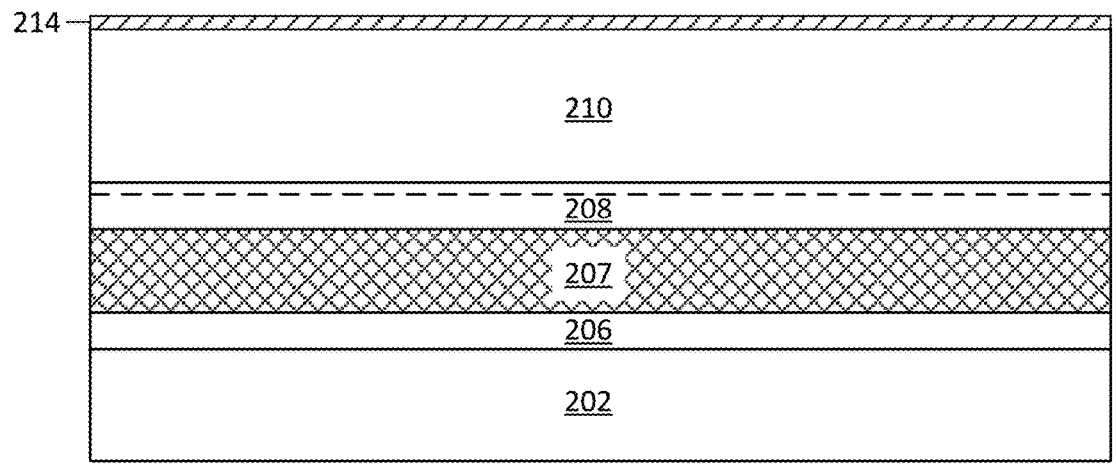
FIGS. 5A-5D illustrate example integrated circuit structures that may be formed when carrying out alternative methods of forming single-flipped resonator device having a III-N 2DEG bottom electrode, in accordance with one or more embodiments of the present disclosure.

FIGS. 5A-5D illustrate possible example structures that may be formed in accordance with alternative formation techniques for producing single-flipped resonator devices, as disclosed herein. In particular, FIG. 5A shows an example transfer wafer that includes transfer substrate 202, nucleation layer 206, buffer layer 207, III-N layer 208 with a 2DEG formed therein, polarization layer 210 and top electrode 214. Transfer substrate 202 may be implemented with any materials previously mentioned, including Si 111. Nucleation layer 206 may be implemented with any appropriate III-N material, such as aluminum nitride (AlN). Buffer layer 207 may also be formed of any suitable III-N material, including AlN, aluminum gallium nitride (AlGaN), and/or gallium nitride (GaN). In some particular embodiments, III-N layer 208 may be formed of GaN and polarization layer 210 may be formed of AlN. Top electrode 214 may be formed of any electrically conductive material, including tungsten (W) and/or molybdenum (Mo).

Figure 5B:
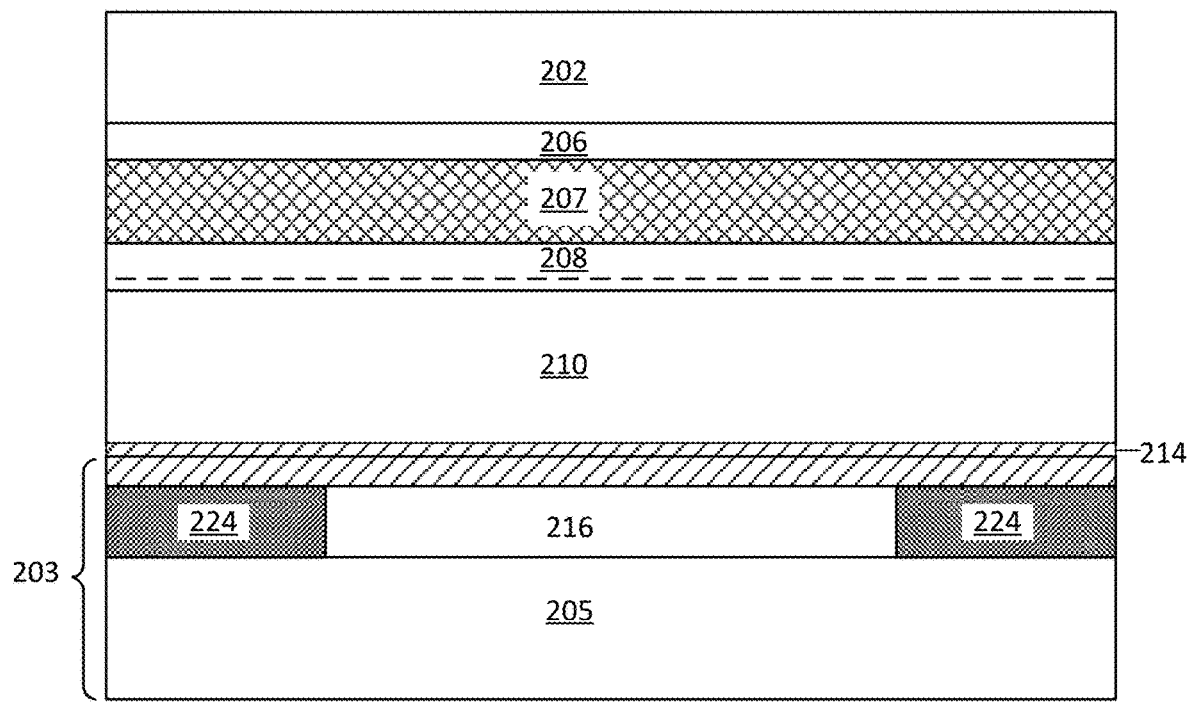

Transfer wafer may then be inverted or single-flipped and bonded to a host wafer 203, to form a structure as shown in FIG. 5B. Bonding may occur by any desired technique, including but not limited to heat, pressure, and/or force. As shown in FIG. 5B, top electrode 214 may be bonded to a metal layer on host wafer 203. In some particular example embodiments, top electrode 214 may be formed of tungsten and may be bonded to a metal layer comprising tungsten in host wafer 203. Host wafer 203 may have any desired configuration, including a pre-formed air cavity 216 (as shown in FIG. 5B), distributed Bragg reflector (DBR), and/or interconnect features (as shown in FIG. 5D). Numerous configurations and variations will be apparent in light of the subject disclosure. In embodiments where host wafer 203 includes a pre-formed air cavity 216, pre-formed air cavity 216 may be formed by recessed areas surrounding material 224, as shown in FIG. 5B. Material 224 may comprise any desired compound(s), including III-N compounds (e.g., AlN, GaN, and AlGaN) and/or inter-layer dielectric (ILD) materials, including various types of metal oxides, such as silicon dioxide.

Figure 5C:
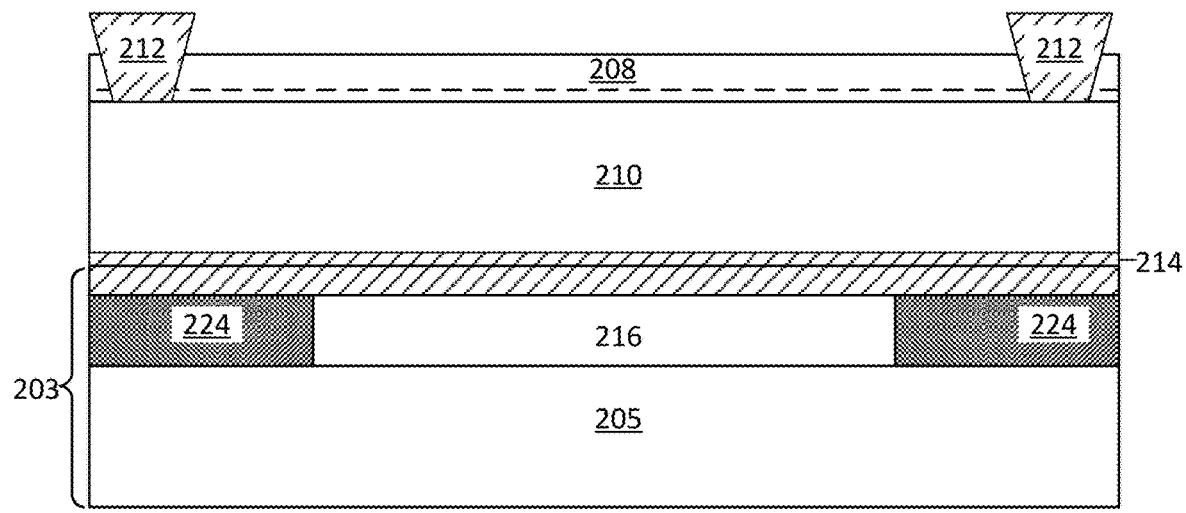
Figure 5D:
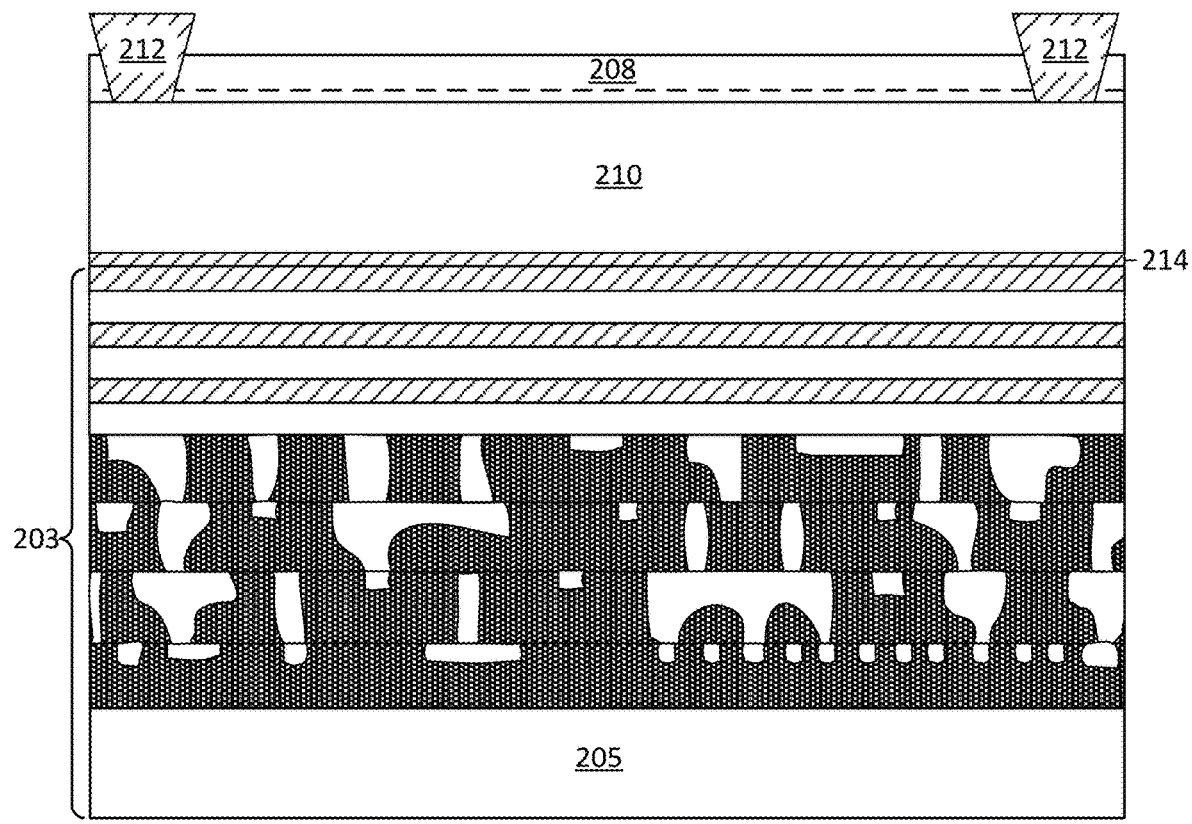

After the transfer wafer has been bonded to the host wafer 203, transfer substrate 202, nucleation layer 206, and/or buffer layer 207 may be removed (e.g., by grinding) to form an example structure as shown in FIG. 5C or 5D, in accordance with some example embodiments. Bottom electrode contact 212 may then be formed on the 2DEG in III-N layer 208, as shown in FIGS. 5C and 5D, in some embodiments. III-N layer 208 may, in some embodiments, be etched or otherwise patterned prior to formation of bottom electrode contact 212. Bottom electrode contact 212 may be implemented with any suitable electrically conductive material, including one or more metals (e.g., titanium, aluminum, nickel, gold, and/or silver). In some embodiments, bottom electrode contact 212 is a stack of at least two metals that are annealed at a high temperature (e.g., approximately 700° C.) to form an ohmic contact to the III-N 2DEG. In some such embodiments, bottom electrode contact 212 may be comprised of titanium and aluminum or may be comprised of titanium, aluminum, nickel, and/or gold, in some example embodiments. Bottom electrode contact 212 may have any desired height or thickness, and in some embodiments, may have a height that is greater than the height of III-N layer 208, as shown in FIGS. 5C and 5D. For example, in some embodiments, bottom electrode contact 212 may have a height of at least 100 nm, at least 500 nm, at least 1 µm, or at least 1.5 µm. In embodiments where bottom electrode contact 212 includes more than one type of metal, the first metal may have a thickness of at least 10 nm, at least 20 nm, or at least 30 nm and the second type of metal mat have a thickness of at least 100 nm, at least 200 nm, or at least 300 nm. Numerous configurations and variations will be apparent in light of the subject disclosure.

In some embodiments, one or more other integrated circuit (IC) devices, such as various diodes (e.g., light-emitting diodes (LEDs) or laser diodes), various transistors (e.g., metal-oxide field-effect transistors (MOSFETs) or tunnel FETs (TFETs)), various microelectromechanical systems (MEMS), various nanoelectromechanical systems (NEMS), various sensors, or any other suitable semiconductor or IC devices, may also be formed on transfer substrate 202, depending on the end use or target application. Accordingly, in some embodiments, resonator structures as described herein may be included in various system-on-chip (SoC) applications, as will be apparent in light of the present disclosure.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the components of the disclosed resonator structures (e.g., FBAR and/or SMR devices having an epitaxial III-N 2DEG bottom electrode).

Example System

Figure 6:
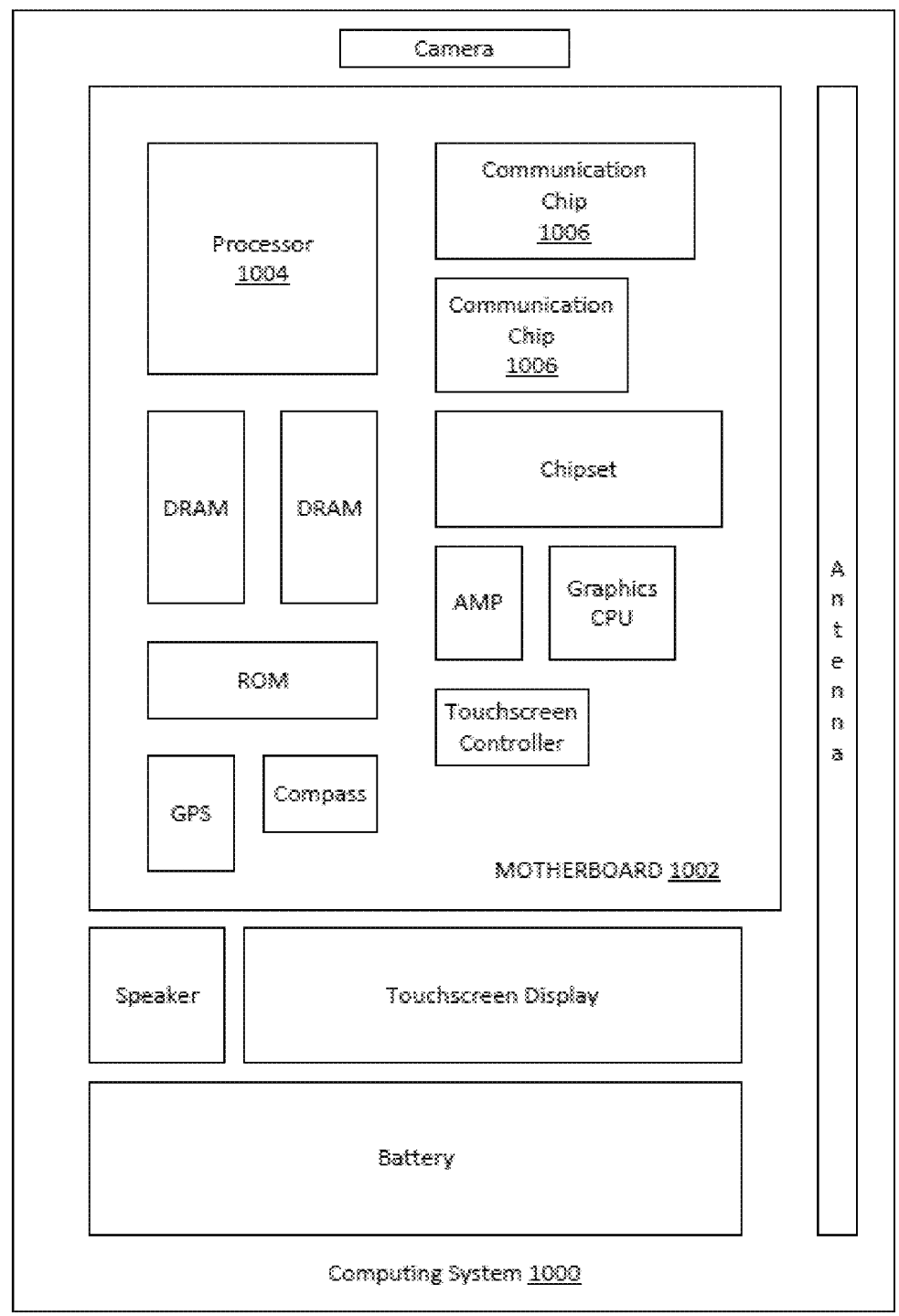
FIG. 6 illustrates an example computing system implemented with one or more integrated circuit structures or devices formed using the techniques disclosed herein, in accordance with various embodiments of the present disclosure.

FIG. 6 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, the communication chip 1006 is implemented with or otherwise includes single-flipped resonator devices having an epitaxial 2DEG bottom electrode as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., FBAR or SMR devices having an epitaxial 2DEG bottom electrode) formed using the disclosed techniques, as variously described herein. The term "processor" may refer to any device or portion of a device that processes, for instance, electronic data from registers and/or memory to transform that electronic data into other electronic data that may be stored in registers and/or memory. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a radio frequency (RF) filter device, that includes a first electrode, a polarization layer at least partially including single crystal material on the first electrode, a III-N layer having a single crystal III-N compound on the polarization layer, a second electrode including a two-dimensional electron gas (2DEG) region in the III-N layer and a substrate under the first electrode, such that the first electrode is between the substrate and the second electrode.

Example 2 includes the subject matter of Example 1, wherein the polarization layer includes aluminum nitride (AlN).

Example 3 includes the subject matter of Example 2, wherein all of the aluminum nitride is epitaxial Example 4 includes the subject matter of Example 2, wherein at least 10% of the AlN is epitaxially grown, such that at least 10% of the AlN is single crystal.

Example 5 includes the subject matter of Example 2, wherein at least 20% of the AlN is epitaxially grown, such that at least 20% of the AlN is single crystal.

Example 6 includes the subject matter of any of Examples 1-5 and further includes a second electrode contact formed in the III-N layer and contacting the 2DEG region.

Example 7 includes the subject matter of Example 6, wherein the first electrode and the second electrode contact each include tungsten or molybdenum.

Example 8 includes the subject matter of any of Examples 1-7, wherein the first electrode is bonded to a metal layer of the substrate.

Example 9 includes the subject matter of any of Examples 1-8, wherein the first electrode is bonded to an oxide layer of the substrate.

Example 10 includes the subject matter of any of Examples 1-9 and further includes an oxide layer underneath the first electrode, wherein the oxide layer is bonded to an oxide layer of the substrate.

Example 11 includes the subject matter of any of Examples 1-10 and further includes an oxide layer underneath the first electrode, wherein the oxide layer is bonded to a metal layer of the substrate.

Example 12 includes the subject matter of any of Examples 1-11, wherein the substrate includes an air cavity.

Example 13 includes the subject matter of any of Examples 1-12, wherein the substrate includes Si 111, Si 110, Si 100 with an offcut of between 2 to 8 degrees toward 110.

Example 14 includes the subject matter of any of Examples 1-13, wherein the substrate includes a distributed Bragg reflector (DBR).

Example 15 includes the subject matter of Example 14, wherein the substrate includes circuitry underlying the DBR.

Example 16 includes the subject matter of any of Examples 1-15, wherein the III-N layer includes single crystal gallium nitride (GaN).

Example 17 includes the subject matter of any of Examples 1-16 and further includes a nucleation layer on at least a portion of the III-N layer.

Example 18 includes the subject matter of Example 17, wherein the nucleation layer includes a single crystal III-N material.

Example 19 includes the subject matter of Example 17 and further includes a shallow trench isolation (STI) material positioned on an upper surface of the III-N layer.

Example 20 includes the subject matter of Example 19, wherein the STI material includes silicon oxide.

Example 21 includes the subject matter of any of Examples 1-20, wherein the RF filter device is one of a bulk acoustic wave filter, a solidly mounted resonator, or a thin-film bulk acoustic resonator.

Example 22 is a system-on-chip (SoC) that includes the RF filter device of any of Examples 1-21.

Example 23 is a mobile computing system that includes the RF filter device of any of Examples 1-21 or the SoC of Example 22.

Example 24 is a method of producing a resonator device, the method including epitaxially depositing a III-N layer on a monocrystalline transfer substrate, epitaxially depositing at least part of a polarization layer on the III-N layer provide a two-dimensional electron gas (2DEG) region in the III-N layer adjacent to the polarization layer, depositing a top electrode on the polarization layer to form a multi-layered structure, flipping the multi-layered structure and bonding the top electrode to a top layer of a pre-patterned host substrate and removing the transfer substrate from the multi-layered structure.

Example 25 includes the subject matter of Example 24, wherein the top layer of the pre-patterned host substrate includes a metal.

Example 26 includes the subject matter of Example 24 or Example 25, wherein the top layer of the pre-patterned host substrate includes an oxide.

Example 27 includes the subject matter of any of Examples 24-26, wherein the host substrate includes a host substrate comprising Si 111, Si 110, Si 100 with an offcut of between 2 to 8 degrees toward 110.

Example 28 includes the subject matter of any of Examples 24-27, wherein the pre-patterned host substrate includes a distributed Bragg reflector (DBR).

Example 29 includes the subject matter of Example 28, wherein the pre-patterned host substrate includes circuitry underlying the DBR.

Example 30 includes the subject matter of any of Examples 24-29, wherein the pre-patterned host substrate includes a pre-formed air cavity.

Example 31 includes the subject matter of any of Examples 24-30, wherein the entire polarization layer includes a single crystal group III-nitride (III-N) compound.

Example 32 includes the subject matter of Example 31, wherein the III-N compound is aluminum nitride.

Example 33 includes the subject matter of Example 32, wherein the aluminum nitride is epitaxially grown on the III-N layer.

Example 34 includes the subject matter of any of Examples 24-33, wherein the top electrode includes tungsten or molybdenum.

Example 35 includes the subject matter of any of Examples 24-34 and further includes forming a nucleation layer on the transfer substrate under the III-N layer.

Example 36 includes the subject matter of Example 35, wherein the nucleation layer includes a single crystal III-N material.

Example 37 includes the subject matter of Example 36 and further includes depositing a shallow trench isolation (STI) material on the transfer substrate and at least partially etching the STI material to form an air cavity underneath at least a portion of the III-N layer.

Example 38 includes the subject matter of Example 37, wherein the STI material includes silicon oxide.

Example 39 includes the subject matter of any of Examples 24-38, wherein the transfer substrate includes a single crystal silicon layer or body.

Example 40 includes the subject matter of any of Examples 24-39, wherein the III-N layer includes single crystal gallium nitride (GaN).

Example 41 includes the subject matter of any of Examples 24-40 and further includes forming a radio frequency (RF) filter device.

Example 42 is a method of producing a resonator device, the method including epitaxially depositing a III-N layer on a monocrystalline transfer substrate, epitaxially depositing at least part of a polarization layer on the III-N layer provide a two-dimensional electron gas (2DEG) region in the III-N layer adjacent to the polarization layer, depositing a top electrode on the polarization layer to form a multi-layered structure, forming an oxide layer on the top electrode, flipping the multi-layered structure and bonding the oxide layer to a top layer of a pre-patterned host substrate and removing the transfer substrate from the multi-layered structure.

Example 43 includes the subject matter of Example 42, wherein the top layer of the pre-patterned host substrate includes a metal.

Example 44 includes the subject matter of Example 42 or Example 43, wherein the top layer of the pre-patterned host substrate includes an oxide.

Example 45 includes the subject matter of any of Examples 42-44, wherein the host substrate includes a host substrate comprising Si 111, Si 110, Si 100 with an offcut of between 2 to 8 degrees toward 110.

Example 46 includes the subject matter of any of Examples 42-45, wherein the pre-patterned host substrate includes a distributed Bragg reflector (DBR).

Example 47 includes the subject matter of Example 46, wherein the pre-patterned host substrate includes circuitry underlying the DBR.

Example 48 includes the subject matter of any of Examples 42-47, wherein the pre-patterned host substrate includes a pre-formed air cavity.

Example 49 includes the subject matter of any of Examples 42-48, wherein the entire polarization layer includes a single crystal group III-nitride (III-N) compound.

Example 50 includes the subject matter of Example 49, wherein the III-N compound is aluminum nitride.

Example 51 includes the subject matter of Example 50, wherein the aluminum nitride is epitaxially grown on the III-N layer.

Example 52 includes the subject matter of any of Examples 42-51, wherein the top electrode includes tungsten or molybdenum.

Example 53 includes the subject matter of any of Examples 42-52 and further includes forming a nucleation layer on the transfer substrate under the III-N layer.

Example 54 includes the subject matter of Example 53, wherein the nucleation layer includes a single crystal III-N material.

Example 55 includes the subject matter of Example 54 and further includes depositing a shallow trench isolation (STI) material on the transfer substrate and at least partially etching the STI material to form an air cavity underneath at least a portion of the III-N layer.

Example 56 includes the subject matter of Example 55, wherein the STI material includes silicon oxide.

Example 57 includes the subject matter of any of Examples 42-56, wherein the transfer substrate includes a single crystal silicon layer or body.

Example 58 includes the subject matter of any of Examples 42-57, wherein the III-N layer includes single crystal gallium nitride (GaN).

Example 59 includes the subject matter of any of Examples 42-58 and further includes forming a radio frequency (RF) filter device.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A radio frequency (RF) filter device, comprising:
a resonator device comprising
a support substrate,
a first electrode over the support substrate,
a first layer comprising a first single crystal material over the first electrode,
a second layer over the first layer, the second layer comprising a second single crystal material compositionally distinct from the first single crystal material and including nitrogen and a group III element, wherein a two-dimensional electron gas (2DEG) region is inducible in the second layer, and wherein the first electrode is between the support substrate and the second layer, and
a second electrode extending through the second layer and comprising a conductive material.

2. The RF filter device of claim 1, wherein the first layer comprises aluminum and nitrogen.

3. The RF filter device of claim 1, wherein the substrate comprises one or more cavities embedded within the substrate.

4. The RF filter device of claim 1, wherein the support substrate comprises a distributed Bragg reflector (DBR).

5. The RF filter device of claim 1, wherein the first layer and the second layer are epitaxial to one another.

6. The RF filter device of claim 1, further comprising a cavity over the first layer and over a portion of the second layer.

7. The RF filter device of claim 1, wherein the first layer comprises aluminum nitride, and the second layer comprises single crystal gallium nitride (GaN).

8. A system-on-chip (SoC) comprising the RF filter device of claim 1.

9. A mobile computing system comprising the RF filter device of claim 1.

10. The RF filter device of claim 1, wherein:
the second layer has a first surface facing the first layer and an opposing second surface; and
the second electrode extends from the second surface of the second layer to at least the first surface of the second layer.

11. The RF filter device of claim 1, wherein:
the second layer has a first surface facing the first layer and an opposing second surface; and
the second electrode extends from the second surface of the second layer to at least the 2 DEG region within the second layer.

12. An integrated circuit device comprising:
a resonator device comprising
a substrate, with one or more cavities within the substrate,
a first electrode over the first substrate,
a first layer comprising a first single crystal material over the first electrode,
a second layer over the first layer, the second layer a second single crystal material comprising nitrogen and a group III element, the second single crystal material of the second layer compositionally distinct from but epitaxial with the first single crystal material of the first layer, wherein the first electrode is between the substrate and the second layer, and
a second electrode extending through the second layer and comprising a conductive material.

13. The integrated circuit device of claim 12, wherein the first layer comprises aluminum and nitrogen.

14. The integrated circuit device of claim 12, wherein the second layer comprises single crystal gallium nitride (GaN).

15. The integrated circuit device of claim 12, further comprising a cavity over the first layer and over a portion of the second layer.

16. A system-on-chip (SoC) comprising the integrated circuit device of claim 12.

17. A mobile computing system comprising the integrated circuit device of claim 12.

18. An integrated circuit device comprising:
a resonator device comprising
a host substrate,
a first electrode over the host substrate,
a first layer over the first electrode, the first layer a first single crystal material comprising aluminum nitride,
a second layer over the first layer, the second layer a second single crystal material comprising gallium and nitrogen, wherein the first electrode is between the host substrate and the second layer, and
a second electrode extending through the second layer and comprising a conductive material.

19. The integrated circuit device of claim 18, the first single crystal material of the first layer epitaxial with the second single crystal material of the first layer.

20. The integrated circuit device of claim 18, further comprising a cavity over the first layer and over a portion of the second layer.

* * * * *